United States Patent
Choi et al.

(10) Patent No.: US 9,286,999 B1
(45) Date of Patent: Mar. 15, 2016

(54) SEMICONDUCTOR DEVICES

(71) Applicant: SK hynix Inc., Icheon-si Gyeongg-do (KR)

(72) Inventors: Joon Woo Choi, Busan (KR); Chang Ki Baek, Anyang-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/686,196

(22) Filed: Apr. 14, 2015

(30) Foreign Application Priority Data

Dec. 23, 2014  (KR) .................. 10-2014-0187492

(51) Int. Cl.
| G11C 8/08 | (2006.01) |
| G11C 17/18 | (2006.01) |
| G11C 17/16 | (2006.01) |
| G11C 29/04 | (2006.01) |

(52) U.S. Cl.
CPC ............... *G11C 17/18* (2013.01); *G11C 17/16* (2013.01); *G11C 29/04* (2013.01)

(58) Field of Classification Search
CPC ........... G11C 8/08; G11C 17/16; G11C 29/08
USPC ..................................... 365/96, 201, 230.06
See application file for complete search history.

(56) References Cited

U.S. PATENT DOCUMENTS

| 5,124,949 A * | 6/1992 | Morigami ............ G11C 29/835 365/189.05 |
| 6,094,387 A * | 7/2000 | Mine .................... G11C 29/835 365/200 |
| 6,333,887 B1 * | 12/2001 | Vo ........................ G11C 29/848 365/200 |
| 2002/0097074 A1 * | 7/2002 | Kim ...................... G11C 7/1051 327/158 |
| 2004/0062110 A1 * | 4/2004 | Shirley ................. G11C 29/842 365/202 |
| 2011/0149665 A1 * | 6/2011 | Koo ....................... G11C 17/16 365/200 |
| 2012/0026809 A1 * | 2/2012 | Yang ..................... G11C 29/28 365/189.15 |
| 2013/0162302 A1 | 6/2013 | Morishita et al. |

FOREIGN PATENT DOCUMENTS

KR        1020050100997 A      10/2005

* cited by examiner

*Primary Examiner* — Michael Tran
(74) *Attorney, Agent, or Firm* — William Park & Associates Ltd.

(57) ABSTRACT

A semiconductor device includes a first input/output (I/O) part buffering command/address (C/A) signals inputted through a first pad part to generate delay address signals, an internal address generator generating a plurality of internal address signals according to a level combination of the delay address signals, and a second I/O part including a plurality of fuses selected by the plurality of internal address signals in a test mode. The plurality of fuses of the second I/O part are programmed according to logic levels of data inputted to the second I/O part through a second pad part to control I/O characteristics of the second I/O part.

25 Claims, 9 Drawing Sheets

SEMICONDUCTOR DEVICES

CROSS-REFERENCE TO RELATED APPLICATION

The present application claims priority under 35 U.S.C 119(a) to Korean Application No. 10-2014-0187492, filed on Dec. 23, 2014, in the Korean Intellectual Property Office, which is incorporated herein by reference in its entirety as set forth in full.

BACKGROUND

1. Technical Field

Embodiments of the invention relate to semiconductor devices.

2. Related Art

Recently, semiconductor memory devices having a high bandwidth have been increasingly demanded to improve their performance. The bandwidth of the semiconductor memory devices may become higher by increasing the number of input/output (I/O) lines of the semiconductor memory devices. The semiconductor memory devices having a lot of I/O lines are referred to as multi-channel wide I/O semiconductor memory devices. Each of the multi-channel wide I/O semiconductor memory devices may include a plurality of memory blocks, and the plurality of memory blocks in each multi-channel wide I/O semiconductor memory device may independently operate without any interference therebetween. In such a case, each of the plurality of memory blocks may correspond to a channel.

Meanwhile, semiconductor devices such as the semiconductor memory devices may be designed to include fuses that store information necessary for various internal control operations, for example, various sting information or repair information. General fuses can be programmed using laser beams in a wafer level because a logic level of each datum is determined according to an electrical open/short state of each fuse. However, once the semiconductor devices are encapsulated to form semiconductor packages, it may be impossible to program the general fuses in the semiconductor packages. E-fuses are widely used to solve the aforementioned disadvantage. Each of the e-fuses may be realized using a transistor, for example, a MOS transistor. In such a case, a datum may be stored in the e-fuse by changing an electrical resistance value between a gate terminal and a source/drain terminal of the MOS transistor used as the e-fuse. That is, the e-fuse may be electrically open or short according to a resistance value between the gate terminal and the source/drain terminal of the MOS transistor employed as the e-fuse.

SUMMARY

According to an embodiment, a semiconductor device includes a first input/output (I/O) part suitable for buffering command/address (C/A) signals inputted through a first pad part to generate delay address signals. The semiconductor device also includes an internal address generator suitable for generating a plurality of internal address signals according to a level combination of the delay address signals. Further, the semiconductor device includes a second I/O part including a plurality of fuses selected by the plurality of internal address signals in a test mode. The plurality of fuses of the second I/O part are programmed according to logic levels of data inputted to the second I/O part through a second pad part to control I/O characteristics of the second I/O part.

According to an embodiment, a semiconductor device includes a first input/output (I/O) part and a second I/O part. The first I/O part includes first to fourth fuses selected by first and second command/address (C/A) signals inputted through a first pad part during a first period in a test mode. The first to fourth fuses are programmed according to logic levels of the first and second C/A signals to control a first I/O characteristic of the first I/O part during a second period in the test mode. The second I/O part includes fifth to eighth fuses selected according to logic levels of first and second data inputted through a second pad part during a third period in the test mode. The fifth to eighth fuses are programmed according to logic levels of the first and second data to control a second I/O characteristic of the second I/O part during a fourth period in the test mode.

In an embodiment, a semiconductor device includes first to fourth command/address (C/A) input/output (I/O) units configured to buffer a plurality of C/A signals to generate a plurality of delay address signals. The semiconductor device also includes an internal address generator configured to generate a plurality of internal address signals sequentially enabled according to a level combination of the plurality of delay address signals. The semiconductor device also includes first to fourth data I/O units including a plurality of fuses sequentially selected by the plurality of internal address signals in a test mode. The plurality of fuses are programmed according to logic levels of data.

DETAILED DESCRIPTION

Embodiments of the invention will be described hereinafter with reference to accompanying figures. However, the various embodiments described herein are for illustrative purposes only and are not intended to limit the scope of the invention.

Figure 1:
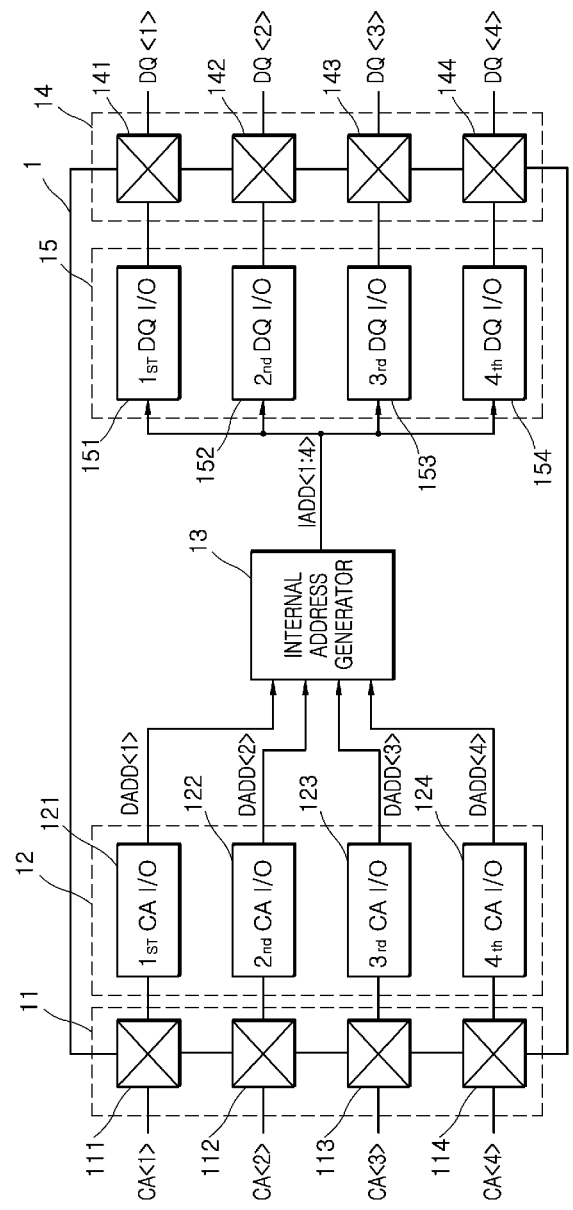
FIG. 1 is a block diagram illustrating a semiconductor device according to an embodiment.

Referring to FIG. 1, a semiconductor device 1 according to an embodiment may include a first pad part 11, a first I/O part 12, an internal address generator 13, a second pad part 14 and a second I/O part 15.

The first pad part 11 may include first to fourth pads 111, 112, 113 and 114 through which first to fourth command/address (C/A) signals CA<1:4> are inputted or outputted, respectively. In an embodiment, the first pad part 11 may be configured to include the first to fourth pads 111, 112, 113 and 114. However, the number of the pads in the first pad part 11 may be less than or greater than four according to various embodiments.

The first I/O part 12 may include first to fourth C/A I/O units 121, 122, 123 and 124.

The first C/A I/O unit 121 may buffer the first C/A signal CA<1> inputted through the first pad 111 to generate a first delay address signal DADD<1>.

The second C/A I/O unit 122 may buffer the second C/A signal CA<2> inputted through the second pad 112 to generate a second delay address signal DADD<2>.

The third C/A I/O unit 123 may buffer the third C/A signal CA<3> inputted through the third pad 113 to generate a third delay address signal DADD<3>.

The fourth C/A I/O unit 124 may buffer the fourth C/A signal CA<4> inputted through the fourth pad 114 to generate a fourth delay address signal DADD<4>.

More specifically, the first I/O part 12 may buffer the first to fourth C/A signals CA<1:4> inputted from the first pad part 11 to generate the first to fourth delay address signals DADD<1:4>.

The internal address generator 13 may generate first to fourth internal address signals IADD<1:4> sequentially enabled according to a level combination of the first to fourth delay address signals DADD<1:4>. According to an embodiment, the semiconductor device 1 may be designed so that the first to fourth internal address signals IADD<1:4> are sequentially generated. However, a sequence that the first to fourth internal address signals IADD<1:4> are generated may not be limited to the an embodiment. In particular, a sequence that the first to fourth internal address signals IADD<1:4> are generated may be set to be different according to various embodiments. Moreover, although the number of bits of the first to fourth internal address signals IADD<1:4> is set to be four in an embodiment, the number of bits of the first to fourth internal address signals IADD<1:4> may not be limited to the various embodiment. That is, the number of bits of the first to fourth internal address signals IADD<1:4> may be set to be different according to various embodiments.

The second pad part 14 may include fifth to eighth pads 141, 142, 143 and 144 through which first to fourth data DQ<1:4> are inputted or outputted, respectively. In an embodiment, the second pad part 14 may be configured to include the fifth to eighth pads 141, 142, 143 and 144. However, the number of the pads in the second pad part 14 may be less than or greater than four according to various embodiments.

The second I/O part 15 may include first to fourth data I/O units 151, 152, 153 and 154.

The first data I/O unit 151 may include first to fourth fuses (F1, F2, F3 and F4 of FIG. 2) sequentially selected by the first to fourth internal address signals IADD<1:4> in a test mode. In addition, the selected one of the first to fourth fuses (F1, F2, F3 and F4 of FIG. 2) may be programmed or non-programmed according to a logic level of the first data DQ<1> to control an I/O characteristic of the first data I/O unit 151. Further, the first data I/O unit 151 may receive or output the first data DQ<1> through the fifth pad 141 with the controlled I/O characteristic if the semiconductor device 1 is out of the test mode.

The second data I/O unit 152 may include a plurality of fuses sequentially selected by the first to fourth internal address signals IADD<1:4> in a test mode. Further, the selected one of the plurality of fuses may be programmed or non-programmed according to a logic level of the second data DQ<2> to control an I/O characteristic of the second data I/O unit 152. In addition, the second data I/O unit 152 may receive or output the second data DQ<2> through the sixth pad 142 with the controlled I/O characteristic if the semiconductor device 1 is out of the test mode.

The third data I/O unit 153 may include a plurality of fuses sequentially selected by the first to fourth internal address signals IADD<1:4> in a test mode. In addition, the selected one of the plurality of fuses may be programmed or non-programmed according to a logic level of the third data DQ<3> to control an I/O characteristic of the third data I/O unit 153. Further, the third data I/O unit 153 may receive or output the third data DQ<3> through the seventh pad 143 with the controlled I/O characteristic if the semiconductor device 1 is out of the test mode.

The fourth data I/O unit 154 may include a plurality of fuses sequentially selected by the first to fourth internal address signals IADD<1:4> in a test mode. Further, the selected one of the plurality of fuses may be programmed or non-programmed according to a logic level of the fourth data DQ<4> to control an I/O characteristic of the fourth data I/O unit 154. In addition, the fourth data I/O unit 154 may receive or output the fourth data DQ<4> through the eighth pad 144 with the controlled I/O characteristic if the semiconductor device 1 is out of the test mode. The logic levels of the first to fourth data DQ<1:4> may be set to control the I/O characteristics of the first to fourth data I/O units 151, 152, 153 and 154 in the test mode. Each of the I/O characteristics of the first to fourth data I/O units 151, 152, 153 and 154 may be controlled to set at least one selected from the group consisting of a delay time for delaying the corresponding one of the first to fourth data DQ<1:4>; a drivability for driving the corresponding one of the first to fourth data DQ<1:4>; and a voltage level of the corresponding one of the first to fourth data DQ<1:4>.

Figure 2:
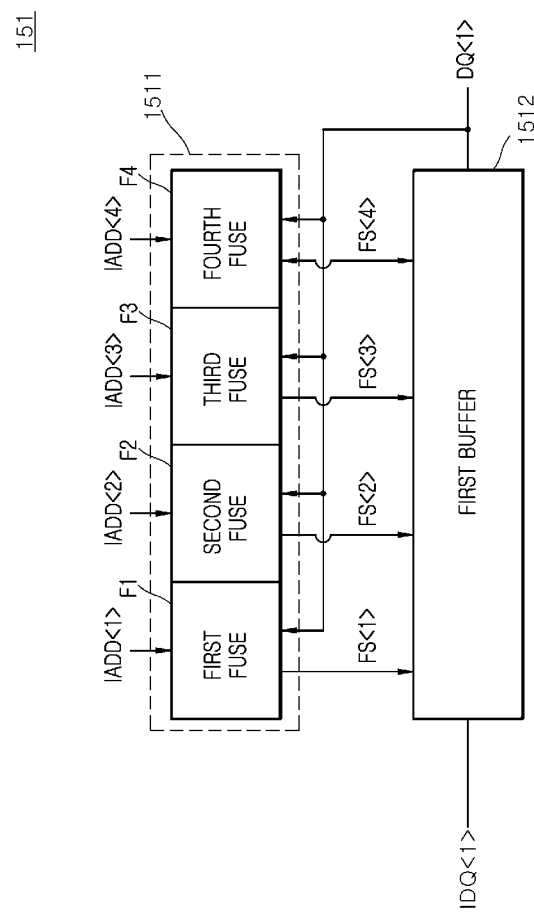
FIG. 2 is a block diagram illustrating a first data I/O unit included in a second I/O part of the semiconductor device shown in FIG. 1.

Referring to FIG. 2, the first data I/O unit 151 may include a first fuse section 1511 and a first buffer 1512.

The first fuse section 1511 may include first to fourth fuses F1, F2, F3 and F4.

The first fuse F1 may be programmed according to a logic level of the first data DQ<1> to generate a first fuse signal FS<1> if the first internal address signal IADD<1> is enabled in the test mode.

The second fuse F2 may be programmed according to a logic level of the first data DQ<1> to generate a second fuse signal FS<2> if the second internal address signal IADD<2> is enabled in the test mode.

The third fuse F3 may be programmed according to a logic level of the first data DQ<1> to generate a third fuse signal FS<3> if the third internal address signal IADD<3> is enabled in the test mode.

The fourth fuse F4 may be programmed according to a logic level of the first data DQ<1> to generate a fourth fuse signal FS<4> if the fourth internal address signal IADD<4> is enabled in the test mode.

More specifically, the first fuse section 1511 may program or non-program the first to fourth fuses F1, F2, F3 and F4, selected by the first to fourth internal address signals IADD<1:4>, according to a logic level of the first data DQ<1> to generate the first to fourth fuse signals FS<1:4>. Each of the first to fourth fuses F1, F2, F3 and F4 may be realized using an e-fuse. In various embodiments, each of the first to fourth fuses F1, F2, F3 and F4 may be realized using a nonvolatile memory cell.

The first buffer 1512 may control the I/O characteristic according to a level combination of the first to fourth fuse signals FS<1:4> in the test mode. Further, the first buffer 1512 may output the first data DQ<1> as a first internal data IDQ<1> or to output the first internal data IDQ<1> as the first data DQ<1> with the controlled I/O characteristic if the semiconductor device 1 is out of the test mode.

Each of the second to fourth data I/O units 152, 153 and 154 may have substantially the same configuration as the first data I/O unit 151. Accordingly, detailed descriptions of the second to fourth data I/O units 152, 153 and 154 will be omitted hereinafter.

Figure 3:
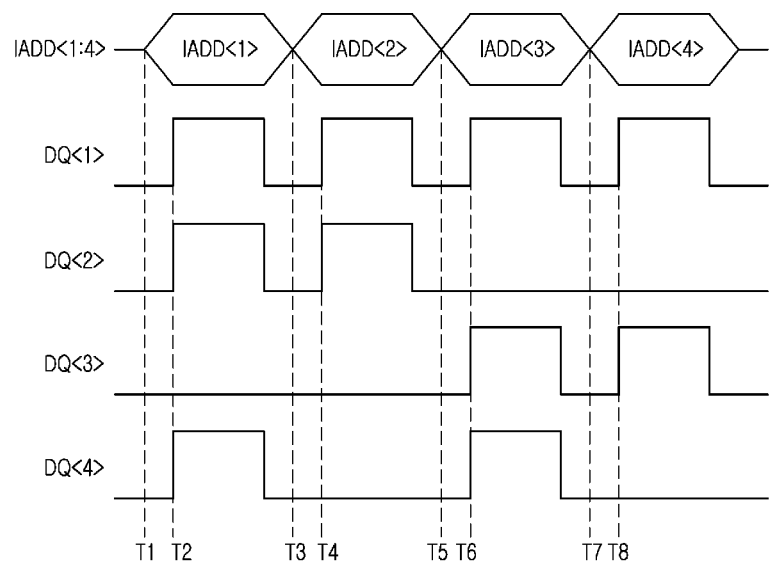
FIG. 3 is a timing diagram illustrating an operation of a semiconductor device according to an embodiment.

An operation of the semiconductor device 1 having the aforementioned configuration will be described with reference to FIG. 3. The I/O characteristics of the first to fourth data I/O units 151, 152, 153 and 154 may be controlled in the test mode. Further, the first to fourth data I/O units 151, 152, 153 and 154 may receive or output the first to fourth data DQ<1:4> with the controlled I/O characteristics if the semiconductor device 1 is out of the test mode.

First, time "T1," the first internal address IADD<1> among the first to fourth internal address signals IADD<1:4> may be enabled by a level combination of the first to fourth C/A signals CA<1:4> in the test mode.

The first fuse section 1511 of the first data I/O unit 151 may select the first fuse F1 among the first to fourth fuses F1–F4 in response to the first internal address signal IADD<1> which is enabled.

Each of the second to fourth data I/O units 152, 153 and 154 may also select a first fuse in response to the first internal address signal IADD<1> which is enabled.

Next, at time "T2," the first fuse F1 of the first fuse section 1511 may be programmed in response to the first data DQ<1> having a logic "high" level to generate the first fuse signal FS<1> having a logic "high" level in the test mode.

The selected fuse of the second data I/O unit 152 may be programmed in response to the second data DQ<2> having a logic "high" level.

The selected fuse of the third data I/O unit 153 may not be programmed in response to the third data DQ<3> having a logic "low" level.

The selected fuse of the fourth data I/O unit 154 may be programmed in response to the fourth data DQ<4> having a logic "high" level.

Next, at time "T3," the second internal address IADD<2> among the first to fourth internal address signals IADD<1:4> may be enabled by a level combination of the first to fourth C/A signals CA<1:4> in the test mode.

The first fuse section 1511 of the first data I/O unit 151 may select the second fuse F2 among the first to fourth fuses F1–F4 in response to the second internal address signal IADD<2> which is enabled.

Each of the second to fourth data I/O units 152, 153 and 154 may also select a second fuse in response to the second internal address signal IADD<2> which is enabled.

Next, at time "T4," the second fuse F2 of the first fuse section 1511 may be programmed in response to the first data DQ<1> having a logic "high" level to generate the second fuse signal FS<2> having a logic "high" level in the test mode.

The selected fuse of the second data I/O unit 152 may be programmed in response to the second data DQ<2> having a logic "high" level.

The selected fuse of the third data I/O unit 153 may not be programmed in response to the third data DQ<3> having a logic "low" level.

The selected fuse of the fourth data I/O unit 154 may not be programmed in response to the fourth data DQ<4> having a logic "low" level.

Next, at time "T5," the third internal address IADD<3> among the first to fourth internal address signals IADD<1:4> may be enabled by a level combination of the first to fourth C/A signals CA<1:4> in the test mode.

The first fuse section 1511 of the first data I/O unit 151 may select the third fuse F3 among the first to fourth fuses F1–F4 in response to the third internal address signal IADD<3> which is enabled.

Each of the second to fourth data I/O units 152, 153 and 154 may also select a third fuse in response to the third internal address signal IADD<3> which is enabled.

Next, at time "T6," the third fuse F3 of the first fuse section 1511 may be programmed in response to the first data DQ<1> having a logic "high" level to generate the third fuse signal FS<3> having a logic "high" level in the test mode.

The selected fuse of the second data I/O unit 152 may not be programmed in response to the second data DQ<2> having a logic "low" level.

The selected fuse of the third data I/O unit 153 may be programmed in response to the third data DQ<3> having a logic "high" level.

The selected fuse of the fourth data I/O unit 154 may be programmed in response to the fourth data DQ<4> having a logic "high" level.

Next, at time "T7," the fourth internal address IADD<4> among the first to fourth internal address signals IADD<1:4> may be enabled by a level combination of the first to fourth C/A signals CA<1:4> in the test mode.

The first fuse section 1511 of the first data I/O unit 151 may select the fourth fuse F4 among the first to fourth fuses F1–F4 in response to the fourth internal address signal IADD<4> which is enabled.

Each of the second to fourth data I/O units 152, 153 and 154 may also select a fourth fuse in response to the fourth internal address signal IADD<4> which is enabled.

Next, at time "T8," the fourth fuse F4 of the first fuse section 1511 may be programmed in response to the first data DQ<1> having a logic "high" level to generate the fourth fuse signal FS<4> having a logic "high" level in the test mode.

The selected fuse of the second data I/O unit 152 may not be programmed in response to the second data DQ<2> having a logic "low" level.

The selected fuse of the third data I/O unit 153 may be programmed in response to the third data DQ<3> having a logic "high" level.

The selected fuse of the fourth data I/O unit 154 may not be programmed in response to the fourth data DQ<4> having a logic "low" level.

The first buffer 1512 and the second to fourth buffers may control the I/O characteristics according to a level combination of the fuse signals FS<1:4> in the test mode. Further, the first buffer 1512 and the second to fourth buffers may receive or output the first to fourth data DQ<1:4> with the controlled I/O characteristics if the semiconductor device 1 is out of the test mode.

As a result, the semiconductor device 1 may control the I/O characteristics of the first to fourth data I/O units 151, 152, 153 and 154 according to a level combination of the fuse signals FS<1:4> in the test mode. Further, the first to fourth data DQ<1:4> may be inputted to or outputted from the first to fourth data I/O units 151, 152, 153 and 154 by the controlled I/O characteristics if the semiconductor device 1 is out of the test mode.

Figure 4:
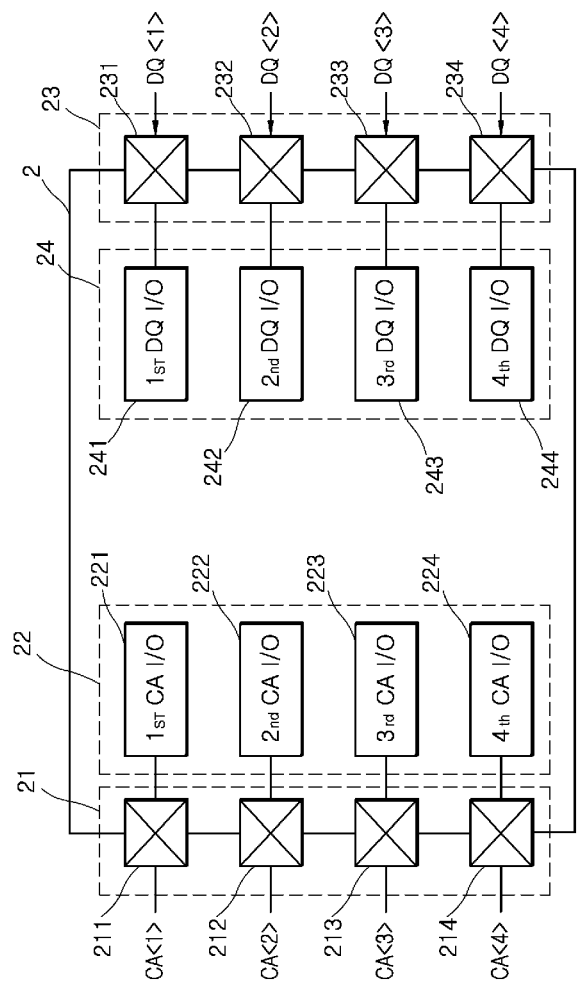
FIG. 4 is a block diagram illustrating a semiconductor device according to an embodiment.

Referring to FIG. 4, a semiconductor device 2 according to an embodiment may include a first pad part 21, a first I/O part 22, a second pad part 23 and a second I/O part 24.

The first pad part 21 may include first to fourth pads 211, 212, 213 and 214 through which first to fourth C/A signals CA<1:4> are inputted or outputted, respectively. In an embodiment, the first pad part 21 may be configured to include the first to fourth pads 211, 212, 213 and 214. However, the number of the pads in the first pad part 21 may be less than or greater than four according to various embodiments.

The first I/O part 22 may include first to fourth C/A I/O units 221, 222, 223 and 224.

The first C/A I/O unit 221 may include first to fourth fuses (F1, F2, F3 and F4 of FIG. 5), one of which is selected by the first C/A signal CA<1> inputted through the first pad 211 during a first period in a test mode. Further, the selected one of the first to fourth fuses (F1, F2, F3 and F4 of FIG. 2) may be programmed or non-programmed according to a logic level of the first C/A signal CA<1> during a second period to control an I/O characteristic of the first C/A I/O unit 221. In addition, the first C/A I/O unit 221 may receive or output the first C/A signal CA<1> through the first pad 211 with the controlled I/O characteristic if the semiconductor device 2 is out of the test mode. The first period may be set to correspond to a time period for selecting a plurality of fuses according to pulses of the first C/A signal CA<1>. Moreover, the second period may be set to correspond to a time period for programming the plurality of fuses according to a logic level of the first C/A signal CA<1>. The first and second periods also may be alternatively and repeatedly set. In particular, the fuses in the first C/A I/O unit 221 may be respectively selected during the first periods, and the selected fuses may be respectively programmed during the second periods. Accordingly, the number of the first periods and the number of the second periods may be set to be equal to the number of the fuses included in the first C/A I/O unit 221.

The second C/A I/O unit 222 may also include first to fourth fuses, one of which is selected by the second C/A signal CA<2> inputted through the second pad 212 during the first period in the test mode. Further, the selected one of the first to fourth fuses may be programmed or non-programmed according to a logic level of the second C/A signal CA<2> during the second period to control an I/O characteristic of the second C/A I/O unit 222. In addition, the second C/A I/O unit 222 may receive or output the second C/A signal CA<2> through the second pad 212 with the controlled I/O characteristic if the semiconductor device 2 is out of the test mode.

The third C/A I/O unit 223 may also include first to fourth fuses, one of which is selected by the third C/A signal CA<3> inputted through the third pad 213 during the first period in the test mode. Further, the selected one of the first to fourth fuses may be programmed or non-programmed according to a logic level of the third C/A signal CA<3> during the second period to control an I/O characteristic of the third C/A I/O unit 223. In addition, the third C/A I/O unit 223 may receive or output the third C/A signal CA<3> through the third pad 213 with the controlled I/O characteristic if the semiconductor device 2 is out of the test mode.

The fourth C/A I/O unit 224 may also include first to fourth fuses, one of which is selected by the fourth C/A signal CA<4> inputted through the fourth pad 214 during the first period in the test mode. Further, the selected one of the first to fourth fuses may be programmed or non-programmed according to a logic level of the fourth C/A signal CA<4> during the second period to control an I/O characteristic of the fourth C/A I/O unit 224. In addition, the fourth C/A I/O unit 224 may receive or output the fourth C/A signal CA<4> through the fourth pad 214 with the controlled I/O characteristic if the semiconductor device 2 is out of the test mode.

Each of the first to fourth C/A signals CA<1:4> may be inputted to one of the first to fourth pads 211~214 in the form of a pulse for selecting a fuse during the first period in the test mode and may have a logic "high" level or a logic "low" level for controlling an I/O characteristic of any one of the first to fourth C/A I/O units 221~224 during the second period in the test mode. In addition, each of the I/O characteristics of the first to fourth C/A I/O units 221~224 may be controlled to set at least one selected from the group consisting of a delay time for delaying the corresponding one of the first to fourth C/A signals CA<1:4>; a drivability for driving the corresponding one of the first to fourth C/A signals CA<1:4>; and a voltage level of the corresponding one of the first to fourth C/A signals CA<1:4>.

The second pad part 23 may include fifth to eighth pads 231, 232, 233 and 234 through which first to fourth data DQ<1:4> are inputted or outputted, respectively. In an embodiment, the second pad part 23 may be configured to include the fifth to eighth pads 231, 232, 233 and 234. However, the number of the pads in the second pad part 23 may be less than or greater than four according to various embodiments.

The second I/O part 24 may include first to fourth data I/O units 241, 242, 243 and 244.

The first data I/O unit 241 may include seventeenth to twentieth fuses (F17, F18, F19 and F20 of FIG. 6), one of which is selected by the first data DQ<1> inputted through the fifth pad 231 during a third period in the test mode. Further, the selected one of the seventeenth to twentieth fuses (F17, F18, F19 and F20 of FIG. 6) may be programmed or non-programmed according to a logic level of the first data DQ<1> inputted during a fourth period to control an I/O characteristic of the first data I/O unit 241. In addition, the first data I/O unit 241 may receive or output the first data DQ<1> through the fifth pad 231 with the controlled I/O characteristic if the semiconductor device 2 is out of the test mode. The third period may be set to correspond to a time period for selecting a plurality of fuses according to pulses of the first data DQ<1> in the test mode. In addition, the fourth period may be set to correspond to a time period for programming the plurality of fuses according to a logic level of the first data DQ<1> in the test mode. Moreover, the third and fourth periods may be alternatively and repeatedly set. More specifically, the fuses in the first data I/O unit 241 may be respectively selected during the third periods, and the selected fuses may be respectively programmed during the fourth periods. Accordingly, the number of the third periods and the number of the fourth periods may be set to be equal to the number of the fuses included in the first data I/O unit 241.

The second data I/O unit 242 may include a plurality of fuses, one of which is selected by the second data DQ<2> inputted through the sixth pad 232 during the third period in the test mode. Further, the selected one of the plurality of fuses may be programmed or non-programmed according to a logic level of the second data DQ<2> during the fourth period to control an I/O characteristic of the second data I/O unit 242. In addition, the second data I/O unit 242 may receive or output the second data DQ<2> through the sixth pad 232 with the controlled I/O characteristic if the semiconductor device 2 is out of the test mode.

The third data I/O unit 243 may include a plurality of fuses, one of which is selected by the third data DQ<3> inputted through the seventh pad 233 during the third period in the test mode. Moreover, the selected one of the plurality of fuses may be programmed or non-programmed according to a logic level of the third data DQ<3> during the fourth period to control an I/O characteristic of the third data I/O unit 243. In addition, the third data I/O unit 243 may receive or output the third data DQ<3> through the seventh pad 233 with the controlled I/O characteristic if the semiconductor device 2 is out of the test mode.

The fourth data I/O unit 244 may include a plurality of fuses, one of which is selected by the fourth data DQ<4> inputted through the eighth pad 234 during the third period in the test mode. In addition, the selected one of the plurality of fuses may be programmed or non-programmed according to a logic level of the fourth data DQ<4> during the fourth period to control an I/O characteristic of the fourth data I/O unit 244. Further, the fourth data I/O unit 244 may receive or output the fourth data DQ<4> through the eighth pad 234 with the controlled I/O characteristic if the semiconductor device 2 is out of the test mode.

Each of the first to fourth data DQ<1:4> may be inputted to one of the fifth to eighth pads 231~234 in the form of a pulse for selecting a fuse during the third period in the test mode and may have a logic "high" level or a logic "low" level for controlling an I/O characteristic of any one of the first to fourth data I/O units 241~244 during the fourth period in the test mode. In addition, each of the I/O characteristics of the first to fourth data I/O units 241~244 may be controlled to set at least one selected from the group consisting of a delay time for delaying the corresponding one of the first to fourth data DQ<1:4>; a drivability for driving the corresponding one of the first to fourth data DQ<1:4>; and a voltage level of the corresponding one of the first to fourth data DQ<1:4>.

Figure 5:
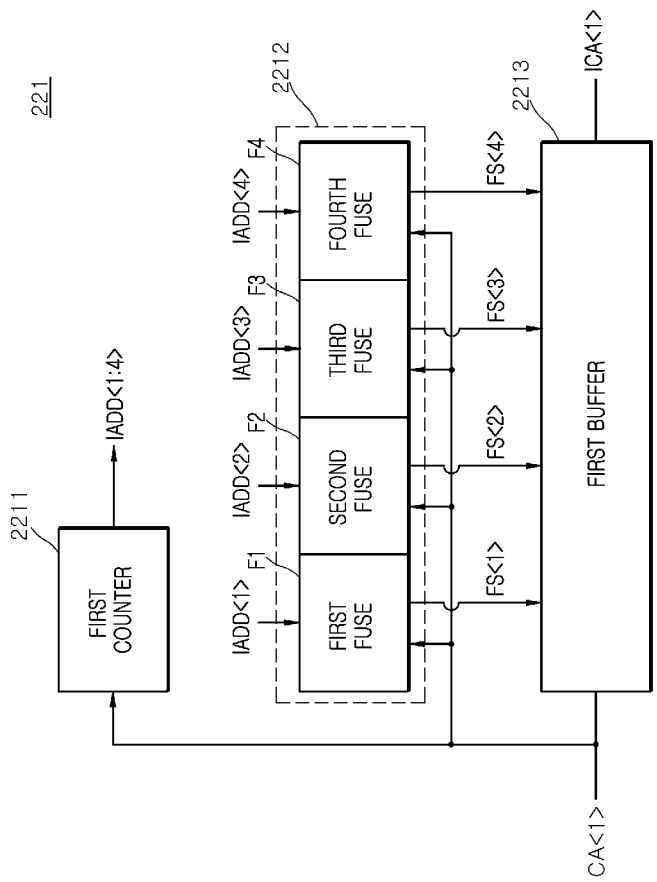
FIG. 5 is a block diagram illustrating a first command/address I/O unit included in a first I/O part of the semiconductor device shown in FIG. 4.

Referring to FIG. 5, the first C/A I/O unit 221 may include a first counter 2211, a first fuse section 2212 and a first buffer 2213.

The first counter 2211 may output first to fourth internal address signals IADD<1:4> sequentially enabled in response to pulses of the first C/A signal CA<1> during the first period in the test mode. According to an embodiment, the semiconductor device 2 may be designed so that the first to fourth internal address signals IADD<1:4> are sequentially generated. However, a sequence that the first to fourth internal address signals IADD<1:4> are generated may not be limited to an embodiment. In particular, a sequence that the first to fourth internal address signals IADD<1:4> are generated may be set to be different according to the embodiments. Moreover, although the number of bits of the first to fourth internal address signals IADD<1:4> is set to be four in an embodiment, the number of bits of the first to fourth internal address signals IADD<1:4> may not be limited to an embodiment. That is, the number of bits of the first to fourth internal address signals IADD<1:4> may be set to be different according to the embodiments.

The first fuse section 2212 may include first to fourth fuses F1, F2, F3 and F4.

The first fuse F1 may be programmed according to a logic level of the first C/A signal CA<1> to generate a first fuse signal FS<1> if the first internal address signal IADD<1> is enabled during the second period in the test mode.

The second fuse F2 may be programmed according to a logic level of the first C/A signal CA<1> to generate a second fuse signal FS<2> if the second internal address signal IADD<2> is enabled during the second period in the test mode.

The third fuse F3 may be programmed according to a logic level of the first C/A signal CA<1> to generate a third fuse signal FS<3> if the third internal address signal IADD<3> is enabled during the second period in the test mode.

The fourth fuse F4 may be programmed according to a logic level of the first C/A signal CA<1> to generate a fourth fuse signal FS<4> if the fourth internal address signal IADD<4> is enabled during the second period in the test mode.

More specifically, the first fuse section 2212 may sequentially or randomly select the first to fourth fuses F1, F2, F3 and F4 in response to the first to fourth internal address signals IADD<1:4> during the first period in the test mode and may program or non-program the selected fuses according to a logic level of the first C/A signal CA<1> to generate the first to fourth fuse signals FS<1:4> during the second period in the test mode. Each of the first to fourth fuses F1, F2, F3 and F4 may be realized using an e-fuse. In various embodiments, each of the first to fourth fuses F1, F2, F3 and F4 may be realized using a nonvolatile memory cell.

The first buffer 2213 may control the I/O characteristic according to a level combination of the first to fourth fuse signals FS<1:4> in the test mode. Further, the first buffer 2213 may output the first C/A signal CA<1> as a first internal C/A signal ICA<1> or to output the first internal C/A signal ICA<1> as the first C/A signal CA<1> with the controlled I/O characteristic if the semiconductor device 2 is out of the test mode.

Each of the second to fourth C/A I/O units 222, 223 and 224 may have substantially the same configuration as the first C/A I/O unit 221. As a result, detailed descriptions of the second to fourth C/A I/O units 222, 223 and 224 will be omitted hereinafter.

Figure 6:
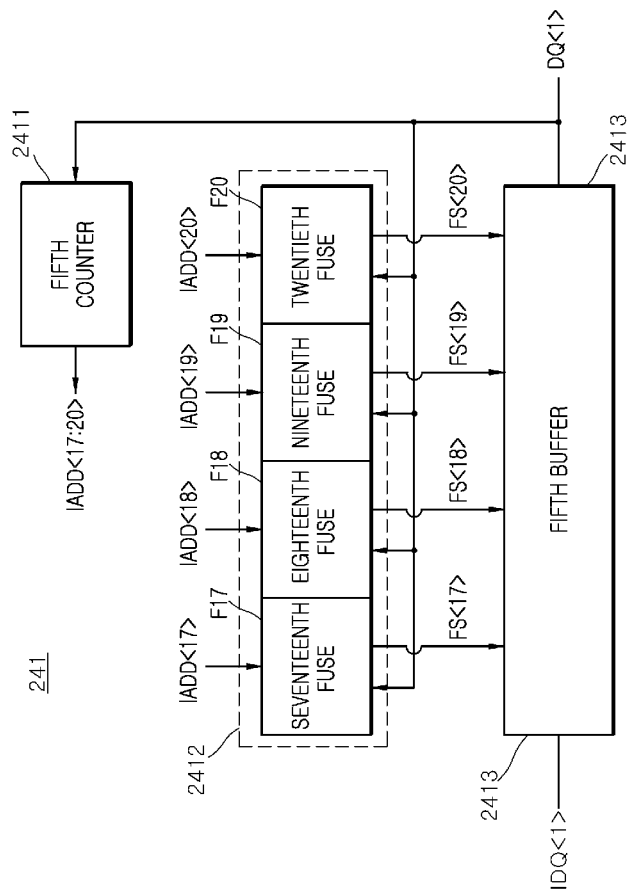
FIG. 6 is a block diagram illustrating a first data I/O unit included in a second I/O part of the semiconductor device shown in FIG. 4.

Referring to FIG. 6, the first data I/O unit 241 may include a fifth counter 2411, a fifth fuse section 2412 and a fifth buffer 2413.

The fifth counter 2411 may output seventeenth to twentieth internal address signals IADD<17:20> sequentially enabled in response to pulses of the first data DQ<1> during the third period in the test mode. According to an embodiment, the semiconductor device 2 may be designed so that the seventeenth to twentieth internal address signals IADD<17:20> are sequentially generated. However, a sequence that the seventeenth to twentieth internal address signals IADD<17:20> are generated may not be limited to such an embodiment. In particular, a sequence that the seventeenth to twentieth internal address signals IADD<17:20> are generated may be set to be different according to various embodiments. Moreover, although the number of bits of the seventeenth to twentieth internal address signals IADD<17:20> is set to be four in an embodiment, the number of bits of the seventeenth to twentieth internal address signals IADD<17:20> may not be limited to such an embodiment. More specifically, the number of bits of the seventeenth to twentieth internal address signals IADD<17:20> may be set to be different according to various embodiments.

The fifth fuse section 2412 may include seventeenth to twentieth fuses F17, F18, F19 and F20.

The seventeenth fuse F17 may be programmed according to a logic level of the first data DQ<1> to generate a seventeenth fuse signal FS<17> if the seventeenth internal address signal IADD<17> is enabled during the fourth period in the test mode.

The eighteenth fuse F18 may be programmed according to a logic level of the first data DQ<1> to generate an eighteenth fuse signal FS<18> if the eighteenth internal address signal IADD<18> is enabled during the fourth period in the test mode.

The nineteenth fuse F19 may be programmed according to a logic level of the first data DQ<1> to generate a nineteenth fuse signal FS<19> if the nineteenth internal address signal IADD<19> is enabled during the fourth period in the test mode.

The twentieth fuse F20 may be programmed according to a logic level of the first data DQ<1> to generate a twentieth fuse signal FS<20> if the twentieth internal address signal IADD<20> is enabled during the fourth period in the test mode.

More specifically, the fifth fuse section 2412 may sequentially or randomly select the seventeenth to twentieth fuses F17, F18, F19 and F20 in response to the seventeenth to twentieth internal address signals IADD<17:20> during the third period in the test mode and may program or non-program the selected fuses according to a logic level of the first data DQ<1> to generate the seventeenth to twentieth fuse signals FS<17:20> during the fourth period in the test mode. Each of the seventeenth to twentieth fuses F17, F18, F19 and F20 may be realized using an e-fuse. In various embodiments, each of the seventeenth to twentieth fuses F17, F18, F19 and F20 may be realized using a nonvolatile memory cell.

The fifth buffer 2413 may control the I/O characteristic according to a level combination of the seventeenth to twentieth fuse signals FS<17:20> in the test mode. Further, the fifth buffer 2413 may output the first data DQ<1> as a first internal data IDQ<1> or to output the first internal data IDQ<1> as the first data DQ<1> with the controlled I/O characteristic if the semiconductor device 2 is out of the test mode.

Each of the second to fourth data I/O units 242, 243 and 244 may have substantially the same configuration as the first data I/O unit 241. Accordingly, detailed descriptions of the second to fourth data I/O units 242, 243 and 244 will be omitted hereinafter.

Figure 7:
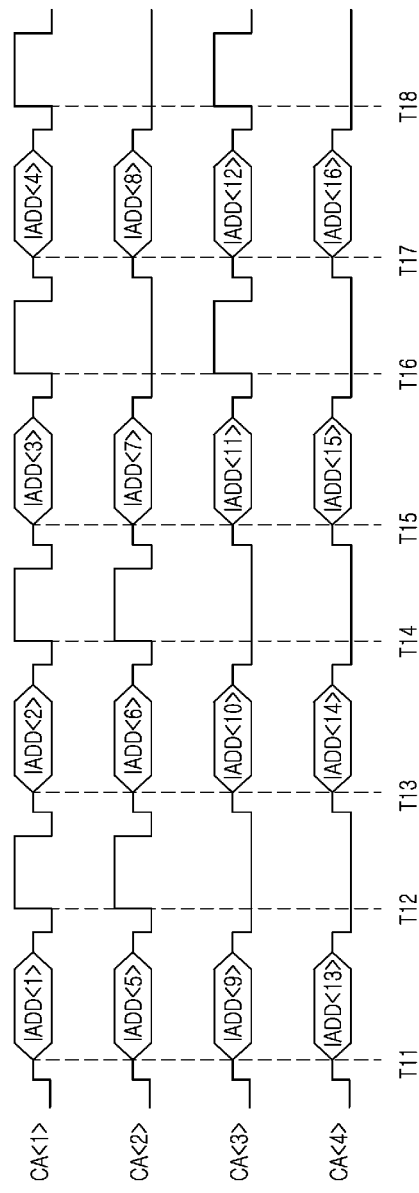
FIGS. 7 and 8 are timing diagrams illustrating operations of a semiconductor device according to an embodiment.

An operation of the semiconductor device 2 having the aforementioned configuration will be described hereinafter with reference to FIG. 7. The I/O characteristics of the first to fourth C/A I/O units 221, 222, 223 and 224 may be controlled in the test mode. In addition, the first to fourth C/A I/O units 221, 222, 223 and 224 may receive or output the first to fourth C/A signals CA<1:4> with the controlled I/O characteristics if the semiconductor device 2 is out of the test mode.

First, at time "T11," the first counter 2211 of the first C/A I/O unit 221 may output the first internal address signal IADD<1> among the first to fourth internal address signals IADD<1:4>, which is enabled in response to a pulse of the first C/A signal CA<1> during the first period in the test mode.

A second counter of the second C/A I/O unit 222 may output a fifth internal address signal IADD<5> among the fifth to eighth internal address signals IADD<5:8>, which is enabled in response to a pulse of the second C/A signal CA<2> during the first period in the test mode.

A third counter of the third C/A I/O unit 223 may output a ninth internal address signal IADD<9> among the ninth to twelfth internal address signals IADD<9:12>, which is enabled in response to a pulse of the third C/A signal CA<3> during the first period in the test mode.

A fourth counter of the fourth C/A I/O unit 224 may output a thirteenth internal address signal IADD<13> among the thirteenth to sixteenth internal address signals IADD<13:16>, which is enabled in response to a pulse of the fourth C/A signal CA<4> during the first period in the test mode.

The first fuse section 2212 of the first C/A I/O unit 221 may select the first fuse F1 among the first to fourth fuses F1~F4 in response to the first internal address signal IADD<1>.

Each of the second to fourth C/A I/O units 222, 223 and 224 may select a fuse corresponding to the selected fuse (i.e., the first fuse F1) of the first C/A I/O unit 221.

Next, at time "T12," the first fuse F1 of the first C/A I/O unit 221 may be programmed in response to the first C/A signal CA<1> having a logic "high" level to generate the first fuse signal FS<1> having a logic "high" level during the second period in the test mode.

The second C/A I/O unit 222 may program the selected fuse in response to the second C/A signal CA<2> having a logic "high" level.

The third C/A I/O unit 223 may not program the selected fuse thereof in response to the third C/A signal CA<3> having a logic "low" level.

The fourth C/A I/O unit 224 may not program the selected fuse thereof in response to the fourth C/A signal CA<4> having a logic "low" level.

Next, at time "T13," the first counter 2211 of the first C/A I/O unit 221 may output the second internal address signal IADD<2> among the first to fourth internal address signals IADD<1:4>, which is enabled in response to a pulse of the first C/A signal CA<1> during the first period in the test mode.

The second counter of the second C/A I/O unit 222 may output the sixth internal address signal IADD<6> among the fifth to eighth internal address signals IADD<5:8> enabled in response to a pulse of the second C/A signal CA<2> during the first period in the test mode.

The third counter of the third C/A I/O unit 223 may output the tenth internal address signal IADD<10> among the ninth to twelfth internal address signals IADD<9:12>, enabled in response to a pulse of the third C/A signal CA<3> during the first period in the test mode.

The fourth counter of the fourth C/A I/O unit 224 may output the fourteenth internal address signal IADD<14> among the thirteenth to sixteenth internal address signals IADD<13:16>, enabled in response to a pulse of the fourth C/A signal CA<4> during the first period in the test mode.

The first fuse section 2212 of the first C/A I/O unit 221 may select the second fuse F2 among the first to fourth fuses F1~F4 in response to the second internal address signal IADD<2>.

Each of the second to fourth C/A I/O units 222, 223 and 224 may select a fuse corresponding to the selected fuse (i.e., the second fuse F2) of the first C/A I/O unit 221.

Next, at time "T14," the second fuse F2 of the first C/A I/O unit 221 may be programmed in response to the first C/A signal CA<1> having a logic "high" level to generate the second fuse signal FS<2> having a logic "high" level during the second period in the test mode.

The second C/A I/O unit 222 may program the selected fuse in response to the second C/A signal CA<2> having a logic "high" level.

The third C/A I/O unit 223 may not program the selected fuse in response to the third C/A signal CA<3> having a logic "low" level.

The fourth C/A I/O unit 224 may not program the selected fuse in response to the fourth C/A signal CA<4> having a logic "low" level.

Next, at time "T15," the first counter 2211 of the first C/A I/O unit 221 may output the third internal address signal IADD<3> among the first to fourth internal address signals IADD<1:4>, enabled in response to a pulse of the first C/A signal CA<1> during the first period in the test mode.

The second counter of the second C/A I/O unit 222 may output the seventh internal address signal IADD<7> among the fifth to eighth internal address signals IADD<5:8>, enabled in response to a pulse of the second C/A signal CA<2> during the first period in the test mode.

The third counter of the third C/A I/O unit 223 may output the eleventh internal address signal IADD<11> among the ninth to twelfth internal address signals IADD<9:12>, enabled in response to a pulse of the third C/A signal CA<3> during the first period in the test mode.

The fourth counter of the fourth C/A I/O unit 224 may output the fifteenth internal address signal IADD<15> among the thirteenth to sixteenth internal address signals IADD<13:16>, enabled in response to a pulse of the fourth C/A signal CA<4> during the first period in the test mode.

The first fuse section 2212 of the first C/A I/O unit 221 may select the third fuse F3 among the first to fourth fuses F1~F4 in response to the third internal address signal IADD<3>.

Each of the second to fourth C/A I/O units 222, 223 and 224 may select a fuse corresponding to the selected fuse (i.e., the third fuse F3) of the first C/A I/O unit 221.

Next, at time "T16," the third fuse F3 of the first C/A I/O unit 221 may be programmed in response to the first C/A signal CA<1> having a logic "high" level to generate the third fuse signal FS<3> having a logic "high" level during the second period in the test mode.

The second C/A I/O unit 222 may not program the selected fuse in response to the second C/A signal CA<2> having a logic "low" level.

The third C/A I/O unit 223 may program the selected fuse in response to the third C/A signal CA<3> having a logic "high" level.

The fourth C/A I/O unit 224 may not program the selected fuse in response to the fourth C/A signal CA<4> having a logic "low" level.

Next, at time "T17," the first counter 2211 of the first C/A I/O unit 221 may output the fourth internal address signal IADD<4> among the first to fourth internal address signals IADD<1:4>, enabled in response to a pulse of the first C/A signal CA<1> during the first period in the test mode.

The second counter of the second C/A I/O unit 222 may output the eighth internal address signal IADD<8> among the fifth to eighth internal address signals IADD<5:8>, enabled in response to a pulse of the second C/A signal CA<2> during the first period in the test mode.

The third counter of the third C/A I/O unit 223 may output the twelfth internal address signal IADD<12> among the ninth to twelfth internal address signals IADD<9:12>, enabled in response to a pulse of the third C/A signal CA<3> during the first period in the test mode.

The fourth counter of the fourth C/A I/O unit 224 may output the sixteenth internal address signal IADD<16> among the thirteenth to sixteenth internal address signals IADD<13:16>, enabled in response to a pulse of the fourth C/A signal CA<4> during the first period in the test mode.

The first fuse section 2212 of the first C/A I/O unit 221 may select the fourth fuse F4 among the first to fourth fuses F1~F4 in response to the fourth internal address signal IADD<4>.

Each of the second to fourth C/A I/O units 222, 223 and 224 may select a fuse corresponding to the selected fuse (i.e., the fourth fuse F4) of the first C/A I/O unit 221.

Next, at time "T18," the fourth fuse F4 of the first C/A I/O unit 221 may be programmed in response to the first C/A signal CA<1> having a logic "high" level to generate the fourth fuse signal FS<4> having a logic "high" level during the second period in the test mode.

The second C/A I/O unit 222 may not program the selected fuse in response to the second C/A signal CA<2> having a logic "low" level.

The third C/A I/O unit 223 may program the selected fuse in response to the third C/A signal CA<3> having a logic "high" level.

The fourth C/A I/O unit 224 may not program the selected fuse in response to the fourth C/A signal CA<4> having a logic "low" level.

The first buffer 2213 and the second to fourth buffers may control the I/O characteristics according to a level combination of the fuse signals FS<1:4> in the test mode. Further, the first buffer 2213 and the second to fourth buffers may receive or output the first to fourth C/A signals CA<1:4> with the controlled I/O characteristics if the semiconductor device 2 is out of the test mode.

As a result, the semiconductor device 2 may control the I/O characteristics of the first to fourth C/A I/O units 221, 222, 223 and 224 according to a level combination of the fuse signals FS<1:4> in the test mode. Further, the first to fourth C/A signals CA<1:4> may be inputted to or outputted from the first to fourth C/A I/O units 221~224 by the controlled I/O characteristics if the semiconductor device 2 is out of the test mode.

Figure 8:
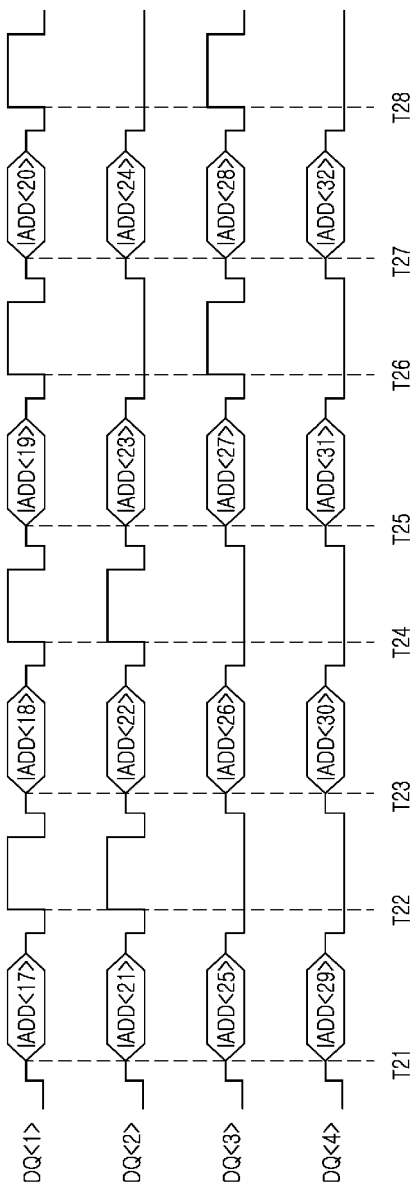

An operation of the semiconductor device 2 having the aforementioned configuration will be described hereinafter with reference to FIG. 8. The I/O characteristics of the first to fourth data I/O units 241, 242, 243 and 244 may be controlled in the test mode. Further, the first to fourth data I/O units 241, 242, 243 and 244 may receive or output the first to fourth data DQ<1:4> with the controlled I/O characteristics if the semiconductor device 2 is out of the test mode.

First, at time "T21," the fifth counter 2411 of the first data I/O unit 241 may output a seventeenth internal address signal IADD<17> among the seventeenth to twentieth internal address signals IADD<17:20>, enabled in response to a pulse of the first data DQ<1> during the third period in the test mode.

A sixth counter of the second data I/O unit 242 may output a twenty-first internal address signal IADD<21> among the twenty-first to twenty-fourth internal address signals IADD<21:24>, enabled in response to a pulse of the second data DQ<2> during the third period in the test mode.

A seventh counter of the third data I/O unit 243 may output a twenty-fifth internal address signal IADD<25> among the twenty-fifth to twenty-eighth internal address signals IADD<25:28>, enabled in response to a pulse of the third data DQ<3> during the third period in the test mode.

An eighth counter of the fourth data I/O unit 244 may output the twenty-ninth internal address signal IADD<29> among the twenty-ninth to thirty-second internal address signals IADD<29:32>, enabled in response to a pulse of the fourth data DQ<4> during the third period in the test mode.

The fifth fuse section 2412 of the first data I/O unit 241 may select the seventeenth fuse F17 among the seventeenth to twentieth fuses F17~F20 in response to the seventeenth internal address signal IADD<17>.

Each of the second to fourth data I/O units 242, 243 and 244 may select a fuse corresponding to the selected fuse (i.e., the seventeenth fuse F17) of the first data I/O unit 241.

Next, at time "T22," the seventeenth fuse F17 of the first data I/O unit 241 may be programmed in response to the first data DQ<1> having a logic "high" level to generate the seventeenth fuse signal FS<17> having a logic "high" level during the fourth period in the test mode.

The second data I/O unit 242 may program the selected fuse in response to the second data DQ<2> having a logic "high" level.

The third data I/O unit 243 may not program the selected fuse in response to the third data DQ<3> having a logic "low" level.

The fourth data I/O unit 244 may not program the selected fuse in response to the fourth data DQ<4> having a logic "low" level.

Next, at time "T23," the fifth counter 2411 of the first data I/O unit 241 may output the eighteenth internal address signal IADD<18> among the seventeenth to twentieth internal address signals IADD<17:20>, enabled in response to a pulse of the first data DQ<1> during the third period in the test mode.

The sixth counter of the second data I/O unit 242 may output the twenty-second internal address signal IADD<22> among the twenty-first to twenty-fourth internal address signals IADD<21:24>, enabled in response to a pulse of the second data DQ<2> during the third period in the test mode.

The seventh counter of the third data I/O unit 243 may output the twenty-sixth internal address signal IADD<26> among the twenty-fifth to twenty-eighth internal address signals IADD<25:28>, enabled in response to a pulse of the third data DQ<3> during the third period in the test mode.

The eighth counter of the fourth data I/O unit 244 may output the thirtieth internal address signal IADD<30> among the twenty-ninth to thirty-second internal address signals IADD<29:32>, enabled in response to a pulse of the fourth data DQ<4> during the third period in the test mode.

The fifth fuse section 2412 of the first data I/O unit 241 may select the eighteenth fuse F18 among the seventeenth to twentieth fuses F17~F20 in response to the eighteenth internal address signal IADD<18>.

Each of the second to fourth data I/O units 242, 243 and 244 may select a fuse corresponding to the selected fuse (i.e., the eighteenth fuse F18) of the first data I/O unit 241.

Next, at time "T24," the eighteenth fuse F18 of the first data I/O unit 241 may be programmed in response to the first data DQ<1> having a logic "high" level to generate the eighteenth fuse signal FS<18> having a logic "high" level during the fourth period in the test mode.

The second data I/O unit 242 may program the selected fuse in response to the second data DQ<2> having a logic "high" level.

The third data I/O unit 243 may not program the selected fuse in response to the third data DQ<3> having a logic "low" level.

The fourth data I/O unit 244 may not program the selected fuse in response to the fourth data DQ<4> having a logic "low" level.

Next, at time "T25," the fifth counter 2411 of the first data I/O unit 241 may output the nineteenth internal address signal IADD<19> among the seventeenth to twentieth internal address signals IADD<17:20>, enabled in response to a pulse of the first data DQ<1> during the third period in the test mode.

The sixth counter of the second data I/O unit 242 may output the twenty-third internal address signal IADD<23> among the twenty-first to twenty-fourth internal address signals IADD<21:24>, enabled in response to a pulse of the second data DQ<2> during the third period in the test mode.

The seventh counter of the third data I/O unit 243 may output the twenty-seventh internal address signal IADD<27> among the twenty-fifth to twenty-eighth internal address signals IADD<25:28>, enabled in response to a pulse of the third data DQ<3> during the third period in the test mode.

The eighth counter of the fourth data I/O unit 244 may output the thirty-first internal address signal IADD<31> among the twenty-ninth to thirty-second internal address signals IADD<29:32>, enabled in response to a pulse of the fourth data DQ<4> during the third period in the test mode.

The fifth fuse section 2412 of the first data I/O unit 241 may select the nineteenth fuse F19 among the seventeenth to twentieth fuses F17~F20 in response to the nineteenth internal address signal IADD<19>.

Each of the second to fourth data I/O units 242, 243 and 244 may select a fuse corresponding to the selected fuse (i.e., the nineteenth fuse F19) of the first data I/O unit 241.

Next, at time "T26," the nineteenth fuse F19 of the first data I/O unit 241 may be programmed in response to the first data DQ<1> having a logic "high" level to generate the nineteenth fuse signal FS<19> having a logic "high" level during the fourth period in the test mode.

The second data I/O unit 242 may not program the selected fuse in response to the second data DQ<2> having a logic "low" level.

The third data I/O unit 243 may program the selected fuse in response to the third data DQ<3> having a logic "high" level.

The fourth data I/O unit 244 may not program the selected fuse in response to the fourth data DQ<4> having a logic "low" level.

Next, at time "T27," the fifth counter 2411 of the first data I/O unit 241 may output the twentieth internal address signal IADD<20> among the seventeenth to twentieth internal address signals IADD<17:20>, enabled in response to a pulse of the first data DQ<1> during the third period in the test mode.

The sixth counter of the second data I/O unit 242 may output the twenty-fourth internal address signal IADD<24> among the twenty-first to twenty-fourth internal address signals IADD<21:24>, enabled in response to a pulse of the second data DQ<2> during the third period in the test mode.

The seventh counter of the third data I/O unit 243 may output the twenty-eighth internal address signal IADD<28> among the twenty-fifth to twenty-eighth internal address signals IADD<25:28>, enabled in response to a pulse of the third data DQ<3> during the third period in the test mode.

The eighth counter of the fourth data I/O unit 244 may output the thirty-second internal address signal IADD<32> among the twenty-ninth to thirty-second internal address signals IADD<29:32>, enabled in response to a pulse of the fourth data DQ<4> during the third period in the test mode.

The fifth fuse section 2412 of the first data I/O unit 241 may select the twentieth fuse F20 among the seventeenth to twentieth fuses F17~F20 in response to the twentieth internal address signal IADD<20>.

Each of the second to fourth data I/O units 242, 243 and 244 may select a fuse corresponding to the selected fuse (i.e., the twentieth fuse F20) of the first data I/O unit 241.

Next, at time "T28," the twentieth fuse F20 of the first data I/O unit 241 may be programmed in response to the first data DQ<1> having a logic "high" level to generate the twentieth fuse signal FS<20> having a logic "high" level during the fourth period in the test mode.

The second data I/O unit 242 may not program the selected fuse in response to the second data DQ<2> having a logic "low" level.

The third data I/O unit 243 may program the selected fuse in response to the third data DQ<3> having a logic "high" level.

The fourth data I/O unit 244 may not program the selected fuse in response to the fourth data DQ<4> having a logic "low" level.

The fifth buffer 2413 and the sixth to eighth buffers may control the I/O characteristics according to a level combination of the fuse signals FS<1:4> in the test mode. Further, the fifth buffer 2413 and the sixth to eighth buffers may receive or output the first to fourth data DQ<1:4> with the controlled I/O characteristics if the semiconductor device 2 is out of the test mode.

As a result, the semiconductor device 2 may control the I/O characteristics of the first to fourth data I/O units 241, 242, 243 and 244 according to a level combination of the fuse signals FS<1:4> in the test mode. In addition, the first to fourth data DQ<1:4> may be inputted to or outputted from the first to fourth data I/O units 241, 242, 243 and 244 by the controlled I/O characteristics if the semiconductor device 2 is out of the test mode.

Figure 9:
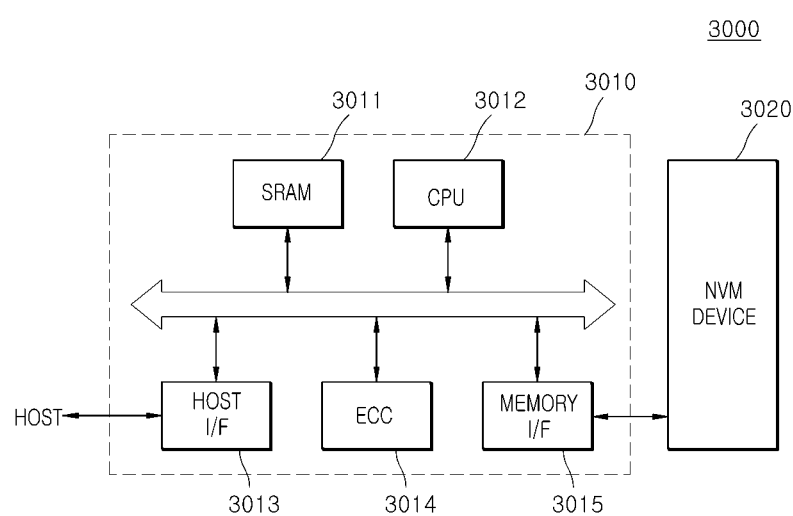
FIG. 9 illustrates a schematic block diagram of a memory system according to an embodiment of the invention.

Referring to FIG. 9, a memory system 3000 may include a non-volatile memory device 3020 and a memory controller 3010. The non-volatile memory device 3020 may be configured to include the above-described semiconductor device. The memory controller 3010 may be configured to control the non-volatile memory device 3020 in a general operation mode.

The memory system 3000 may be a solid state disk (SSD) or a memory card in which the memory device 3020 and the memory controller 3010 are combined. The SRAM 3011 may function as an operation memory of a processing unit (CPU) 3012. A host interface 3013 may include a data exchange protocol of a host being electrically coupled to the memory system 3100. An error correction code (ECC) block 3014 may detect and correct errors included in a data read from the non-volatile memory device 3020. A memory interface (I/F) 3015 may interface with the non-volatile memory device 3120. The CPU 3012 may perform the general control operation for data exchange of the memory controller 3100.

The non-volatile memory device 3020 may be a multi-chip package composed of a plurality of flash memory chips. The memory system 3000 may include a flash memory.

According to various embodiments described above, I/O characteristics of a plurality of I/O units of an I/O part included in a semiconductor device may be independently controlled. In addition, the I/O part may receive or output data or C/A signals with the controlled I/O characteristics of the I/O units.

What is claimed is:

1. A semiconductor device comprising:
   a first input/output (I/O) part suitable for buffering command/address (C/A) signals inputted through a first pad part to generate delay address signals;
   an internal address generator suitable for generating a plurality of internal address signals according to a level combination of the delay address signals; and
   a second I/O part including a plurality of fuses selected by the plurality of internal address signals in a test mode,
   wherein the plurality of fuses of the second I/O part are programmed according to logic levels of data inputted to the second I/O part through a second pad part to control I/O characteristics of the second I/O part.

2. The semiconductor device of claim 1, wherein the second I/O part receives or outputs the data through the second pad part with the controlled I/O characteristics out of the test mode.

3. The semiconductor device of claim 1, wherein each of the I/O characteristics of the second I/O part includes at least one selected from the group consisting of a delay time for delaying the data, a drivability for driving the data, and a voltage level of the data.

4. The semiconductor device of claim 1,
   wherein the C/A signals include a first C/A signal and a second C/A signal; and
   wherein the delay address signals include a first delay address signal and a second delay address signal.

5. The semiconductor device of claim 4, wherein the first I/O part includes:
   a first C/A I/O unit suitable for buffering the first C/A signal inputted through the first pad part to generate the first delay address signal; and
   a second C/A I/O unit suitable for buffering the second C/A signal inputted through the second pad part to generate the second delay address signal.

6. The semiconductor device of claim 1,
   wherein the plurality of fuses include a first fuse, a second fuse, a third fuse and a fourth fuse;
   wherein the plurality of internal address signals include a first internal address signal and a second internal address signal; and
   wherein the data include a first data and a second data.

7. The semiconductor device of claim 6, wherein the second I/O part includes:
   a first data I/O unit suitable for controlling the I/O characteristic according to logic levels of the first and second internal address signals and a logic level of a first data inputted through the second pad part in the test mode and suitable for receiving or outputting the first data with the controlled I/O characteristic out of the test mode; and
   a second data I/O unit suitable for controlling the I/O characteristic according to logic levels of the first and second internal address signals and a logic level of a second data inputted through the second pad part in the test mode and suitable for receiving or outputting the second data with the controlled I/O characteristic out of the test mode.

8. The semiconductor device of claim 7, wherein the first data I/O unit includes:
   a first fuse section including the first and second fuses selected by the first and second internal address signals and are programmed according to a logic level of the first data to generate first and second fuse signals in the test mode; and
   a first buffer suitable for controlling the I/O characteristic according to a level combination of the first and second fuse signals in the test mode and suitable for outputting the first data as a first internal data or outputting the first internal data as the first data with the controlled I/O characteristic out of the test mode.

9. The semiconductor device of claim 7, wherein the second data I/O unit includes:
   a second fuse section including the third and fourth fuses selected by the first and second internal address signals and are programmed according to a logic level of the second data to generate third and fourth fuse signals in the test mode; and
   a second buffer suitable for controlling the I/O characteristic according to a level combination of the third and fourth fuse signals in the test mode and suitable for outputting the second data as a second internal data or outputting the second internal data as the second data with the controlled I/O characteristic out of the test mode.

10. A semiconductor device comprising:
    a first input/output (I/O) part including first to fourth fuses selected by first and second command/address (C/A) signals inputted through a first pad part during a first period in a test mode, the first to fourth fuses being programmed according to logic levels of the first and second C/A signals to control a first I/O characteristic of the first I/O part during a second period in the test mode; and
    a second I/O part including fifth to eighth fuses selected according to logic levels of first and second data inputted through a second pad part during a third period in the test mode, the fifth to eighth fuses being programmed according to logic levels of the first and second data to control a second I/O characteristic of the second I/O part during a fourth period in the test mode.

11. The semiconductor device of claim 10, wherein the first I/O part receives or outputs the first and second C/A signals through the first pad part with the controlled first I/O characteristic out of the test mode.

12. The semiconductor device of claim 10, wherein the second I/O part receives or outputs the first and second data through the second pad part with the controlled second I/O characteristic out of the test mode.

13. The semiconductor device of claim 10, wherein the first I/O characteristic includes at least one selected from a group consisting of a delay time for delaying the first and second C/A signals, a drivability for driving the first and second C/A signals, and a voltage level of the first and second C/A signals.

14. The semiconductor device of claim 10, wherein the second I/O characteristic includes at least one selected from a group consisting of a delay time for delaying the first and second data, a drivability for driving the first and second data, and a voltage level of the first and second data.

15. The semiconductor device of claim 10, wherein the first I/O part includes:
a first C/A I/O unit suitable for selecting one of the first and second fuses according to the first C/A signal during the first period in the test mode and programming the selected fuse of the first and second fuses to control the first I/O characteristic during the second period in the test mode and suitable for receiving or outputting the first C/A signal with the controlled first I/O characteristic out of the test mode; and
a second C/A I/O unit suitable for selecting one of the third and fourth fuses according to the second C/A signal during the first period in the test mode and programming the selected fuse of the first and second fuses to control the first I/O characteristic during the second period in the test mode and suitable for receiving or outputting the second C/A signal with the controlled first I/O characteristic out of the test mode.

16. The semiconductor device of claim 15, wherein the first C/A I/O unit includes:
a first fuse section including the first and second fuses, one of which is selected by the first C/A signal during the first period in the test mode, the selected fuse of the first and second fuses being programmed according to a logic level of the first C/A signal to generate first and second fuse signals during the second period in the test mode; and
a first buffer suitable for controlling the first I/O characteristic according to a level combination of the first and second fuse signals in the test mode and suitable for outputting the first C/A signal as a first internal C/A signal or outputting the first internal C/A signal as the first C/A signal with the controlled first I/O characteristic out of the test mode.

17. The semiconductor device of claim 16, wherein the second C/A I/O unit includes:
a second fuse section including the third and fourth fuses, one of which is selected by the second C/A signal during the first period in the test mode, the selected fuse of the first and second fuses being programmed according to a logic level of the second C/A signal to generate third and fourth fuse signals during the second period in the test mode; and
a second buffer suitable for controlling the first I/O characteristic according to a level combination of the third and fourth fuse signals in the test mode and suitable for outputting the second C/A signal as a second internal C/A signal or outputting the second internal C/A signal as the second C/A signal with the controlled first I/O characteristic out of the test mode.

18. The semiconductor device of claim 10, wherein the second I/O part includes:
a first data I/O unit suitable for selecting one of the fifth and sixth fuses according to the first data during the third period in the test mode and programming the selected fuse of the fifth and sixth fuses to control the second I/O characteristic during the fourth period in the test mode and suitable for receiving or outputting the first data with the controlled second I/O characteristic out of the test mode; and
a second data I/O unit suitable for selecting one of the seventh and eighth fuses according to the second data during the third period in the test mode and programming the selected fuse of the seventh and eighth fuses to control the second I/O characteristic during the fourth period in the test mode and suitable for receiving or outputting the second data with the controlled second I/O characteristic out of the test mode.

19. The semiconductor device of claim 17, wherein the first data I/O unit includes:
a third fuse section including the fifth and sixth fuses, one of which is selected by the first data during the third period in the test mode, the selected fuse of the fifth and sixth fuses being programmed according to a logic level of the first data to generate fifth and sixth fuse signals during the fourth period in the test mode; and
a third buffer suitable for controlling the second I/O characteristic according to a level combination of the fifth and sixth fuse signals, in the test mode and suitable for outputting the first data as a first internal data or outputting the first internal data as the first data with the controlled second I/O characteristic out of the test mode.

20. The semiconductor device of claim 19, wherein the second data I/O unit includes:
a fourth fuse section including the seventh and eighth fuses, one of which is selected by the second data during the third period in the test mode, the selected fuse of the seventh and eighth fuses being programmed according to a logic level of the second data to generate seventh and eighth fuse signals during the fourth period in the test mode; and
a fourth buffer suitable for controlling the second I/O characteristic thereof according to a level combination of the seventh and eighth fuse signals, in the test mode and suitable for outputting the second data as a second internal data or outputting the second internal data as the second data with the controlled second I/O characteristic out of the test mode.

21. A semiconductor device comprising:
first to fourth command/address (C/A) input/output (I/O) units configured to buffer a plurality of C/A signals to generate a plurality of delay address signals;
an internal address generator configured to generate a plurality of internal address signals sequentially enabled according to a level combination of the plurality of delay address signals; and
first to fourth data I/O units including a plurality of fuses sequentially selected by the plurality of internal address signals in a test mode,
wherein the plurality of fuses are programmed according to logic levels of data.

22. The semiconductor device of claim 21, further comprising:

a fuse section configured to program the plurality of fuses to generate a plurality of fuse signals.

23. The semiconductor device of claim 22, further comprising:
a buffer configured to control an I/O characteristic of a level combination of the plurality of fuse signals.

24. The semiconductor device of claim 22, wherein the plurality of fuses are programmed to generate the plurality of fuse signals when the plurality of internal address signals are enabled in the test mode.

25. The semiconductor device of claim 22, wherein one or more of the plurality of fuses may be programmed to control an I/O data characteristic of one or more of the first to fourth data I/O units.

* * * * *